United States Patent [19]

Kurashima

[11] Patent Number: 5,365,406
[45] Date of Patent: Nov. 15, 1994

[54] MASTER-SLICE TYPE SEMICONDUCTOR INTEGRATED CIRCUIT DEVICE

[75] Inventor: Yasumi Kurashima, Tokyo, Japan
[73] Assignee: NEC Corporation, Japan
[21] Appl. No.: 828,368
[22] Filed: Jan. 30, 1992
[30] Foreign Application Priority Data Feb. 1, 1991 [JP] Japan .................. 3-011809

[51] Int. Cl.⁵ .......... H05K 7/02; H01L 29/44
[52] U.S. Cl. .................. 361/777; 174/52.4; 174/261; 257/678; 361/820
[58] Field of Search .......... 29/829, 846; 174/261, 174/52.4; 257/692–698; 333/238, 1, 12; 361/406, 407, 409, 410, 777, 778, 779, 780, 820; 439/59, 92, 108, 607, 608, 637, 924

[56] References Cited

U.S. PATENT DOCUMENTS 4,689,441  8/1987  Dick et al. .................. 361/777
4,831,497  5/1989  Webster et al. .............. 361/406

FOREIGN PATENT DOCUMENTS 53-26978  3/1978  Japan .................. 439/637
57-115893  7/1982  Japan .................. 361/777

*Primary Examiner*—Leo P. Picard
*Assistant Examiner*—Donald A. Sparks
*Attorney, Agent, or Firm*—Laff, Whitesel, Conte & Saret

[57] ABSTRACT

A master-slice type semiconductor chip in the form of a PGA package has a plurality of external pins arranged in a plurality of rows. The external pins of at least the outermost row are electrically connected to an input cell on the semiconductor chip, while the external pins of at least the innermost row is connected to an input-/output cell provided on the semiconductor chip. With this arrangement, the wires in the package connected to the input/output cell can have smaller lengths than the wires connected to the input cell, so that crosstalk noises produced by output signals can be reduced.

6 Claims, 3 Drawing Sheets

MASTER-SLICE TYPE SEMICONDUCTOR INTEGRATED CIRCUIT DEVICE

BACKGROUND OF THE INVENTION

1. Field of the Invention

The present invention relates to a master-slice type semiconductor integrated circuit device and, more particularly, to a master-slice type semiconductor integrated circuit device whose package is a PGA (Pin Grid Array).

2. Description of the Related Art

Hitherto, master-slice type semiconductor integrated circuit devices as a semi-custom products mounting PGA packages have been known.

There are a variety of types of such known master-slice type semiconductor integrated circuit devices. For instance, devices have been known in which all the signal pins of the PGA package are used as input/output pins, as well as devices in which the signal pins on a pair of opposing sides of the PGA are used as input/output signal pins while the signal pins on the other pair of opposing sides of the PGA are exclusively used as input pins. Known master-slice type semiconductor integrated circuit devices also employ a two-layered wiring structure for the PGA as shown in FIGS. 1A and 1B. In this structure, in order to equalize the voltage drops of signals on all the signal pins caused by the resistances of the wires 1, 2 in the package 10, the widths of the wires are so determined that the wires having greater lengths, i.e., the signal lines connected to the pins which are remoter from the center of the package, have greater widths, thus equalizing the resistances of tile wires 1, 2 connected to all signal pins.

The known master-slice type semiconductor integrated circuit device of the type described encounters with a problem in that a large crosstalk noise is generated in the wires connected to the pins which are remotest from the center of the package (referred to as "outermost pins") as compared with the wires connected to the pins closest to the center of the package (referred to as "innermost pins"). This is partly because the pitch of the wires connected to the outermost pins is small due to large widths of these wires and partly because the lengths of these wires are long.

In these known master-slice type semiconductor integrated circuit device, there is a possibility that the output signals are equally allocated to all the signal pins including the pins remoter from the package center and the pins closer to the package pins. If output signals are allocated to the outermost pins aid if these output signals are generated concurrently, very large crosstalk noises are generated in the wires connected to these pins, resulting in a risk of malfunction of an annexed device.

SUMMARY OF THE INVENTION

Accordingly, an object of the present invention is to provide a master-slice type semiconductor integrated circuit device having a PGA package mounting a master-slice type semiconductor chip, the device being improved to reduce crosstalk between adjacent signal lines.

To this end, according to the present invention, there is provided a master-slice type semiconductor integrated circuit device having a PGA package mounting a master-slice type semiconductor chip, the PGA package having a plurality of external pins arranged ill a plurality of rows around the body of the package, wherein the improvement comprises that the external pins of at least the outermost row are used exclusively for input signals, while the external pins of at least the innermost row are used for output signals or for both input and output signals, and the signal lines in the package connected to the external pins which are exclusively used for input signals are made to have narrower widths than the signal lines connected to the external pins which are used for output signals or both for input and output signals.

The above and other objects, features and advantages of tile present invention will become clear from the following description when the same is read in conjunction with the accompanying drawings.

DESCRIPTION OF THE PREFERRED EMBODIMENTS

Figure 1A:
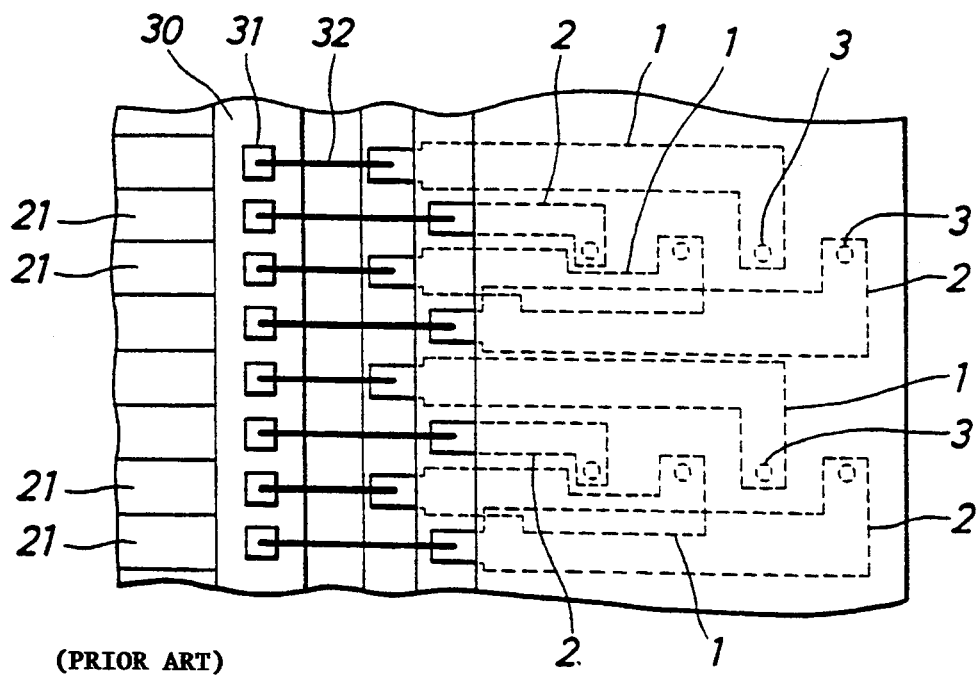
FIGS. 1A and 1B are a fragmentary plan view and a fragmentary sectional view of a conventional master-slice type semiconductor integrated circuit device.
Figure 1B:
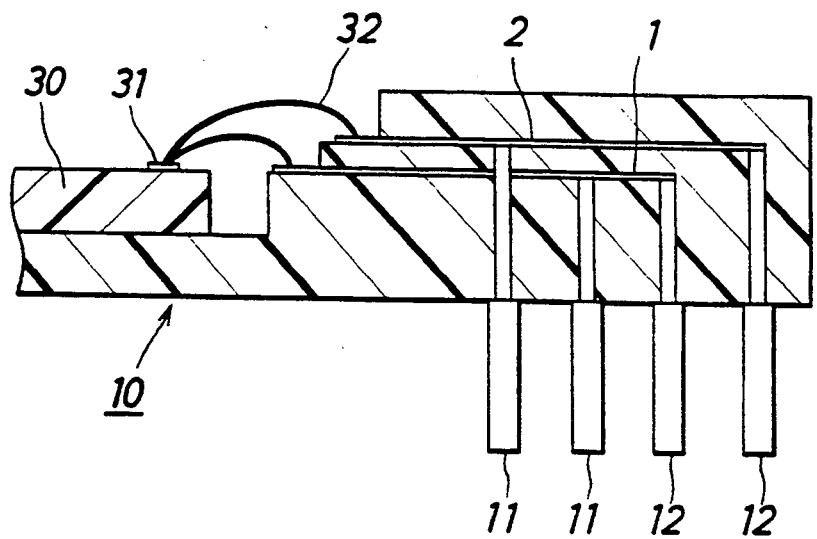
Figure 2A:
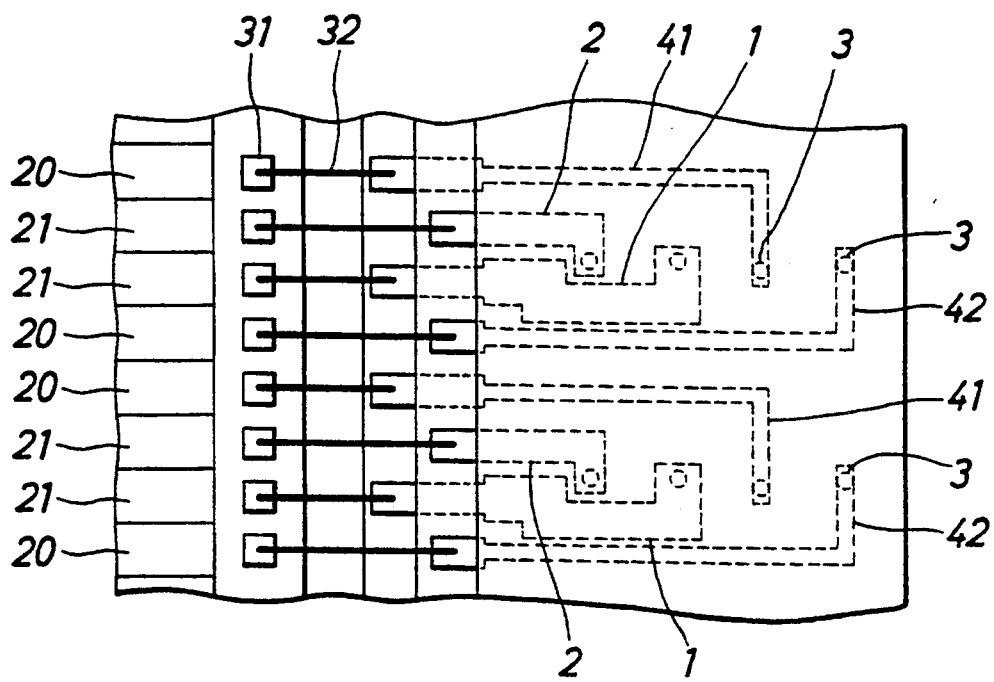
FIGS. 2A and 2B are a fragmentary plan view and a fragmentary sectional view of an embodiment of the master-slice type semiconductor integrated circuit device in accordance with the present invention.
Figure 2B:
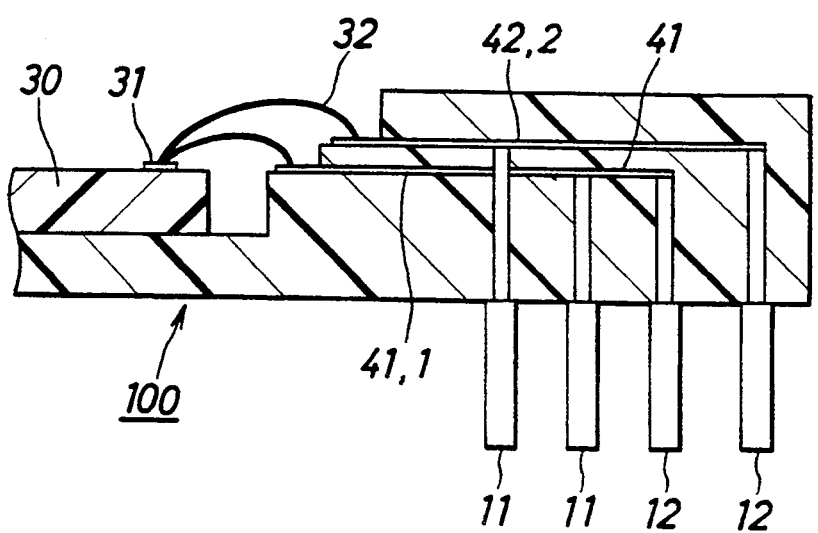

Referring to FIGS. 2A and 2B showing an embodiment of the present invention, a PGA package 100 mounting a master-slice type semiconductor chip 30 has four rows of external pins 11, 11, 12, 12. The external pins 12, 12 which are on the outer two rows (referred to as "outer external pins") are connected to wires 41 on the upper wiring layer and to wires 42 on the lower wiring layer via contact holes 3, 3 formed in the package 100. These wires 41, 42 are connected to different bonding pads 31, 31 in input cells 20, 20 on the semiconductor chip 30, through different bonding wires 32, 32. Similarly, the external pins 11, 11 on the inner two rows (referred to as "inner external pins") are connected to differently bonding pads 31, 31 of an input/output cells 21, 21 via wires 1, 2 and different bonding wires 32, 32. Thus, there is a possibility that output signals are allocated to the wires 1, 2 connected to the inner external pins 11, 11 conduct output signals. Therefore, the widths of the wires 1, 2 connected to the inner external pins 11,11 are so determined that the wires having greater lengths have wider widths, thus uniformalizing the resistance along these wires. In contrast, the wires 41, 42 connected to the outer external pins 12, 12 are used exclusively for input signals, so that these wires conduct only small electrical currents. This means that the drops of signal voltages along the wires connected to the outer external pins 12, 12 are not substantial. These wires, therefore, can have smaller widths as compared with the wires which are used both for input and output signals. Consequently, the pitch or distance between adjacent signal lines connected to the outer external pins can be increased and, therefore, crosstalk noises in the signal lines connected to the outer external pins can be reduced as compared to that in conventional master-slice type semiconductor integrated circuit device. Furthermore, since the output signals which induce most of the crosstalk noises are allocated to inner external pins 11, 11, the lengths of the signal lines connected to these external pins become smaller and generation of crosstalk noise is greatly reduced.

Figure 3A:
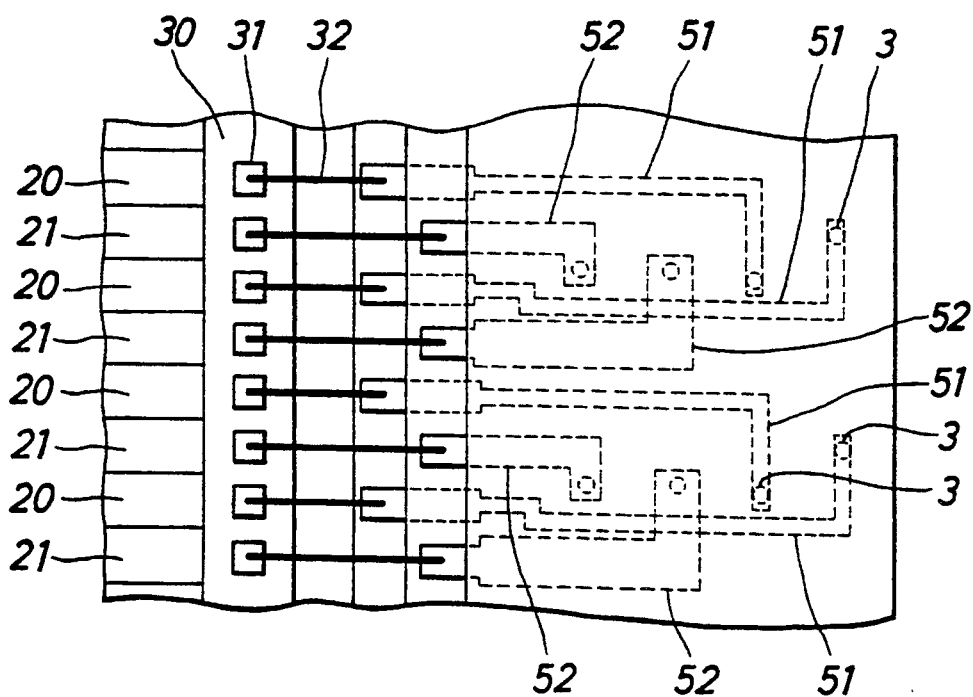
FIGS. 3A and 3B are a fragmentary plan view and a fragmentary sectional view of another embodiment of the master-slice type semiconductor integrated circuit device in accordance with the present invention.
Figure 3B:
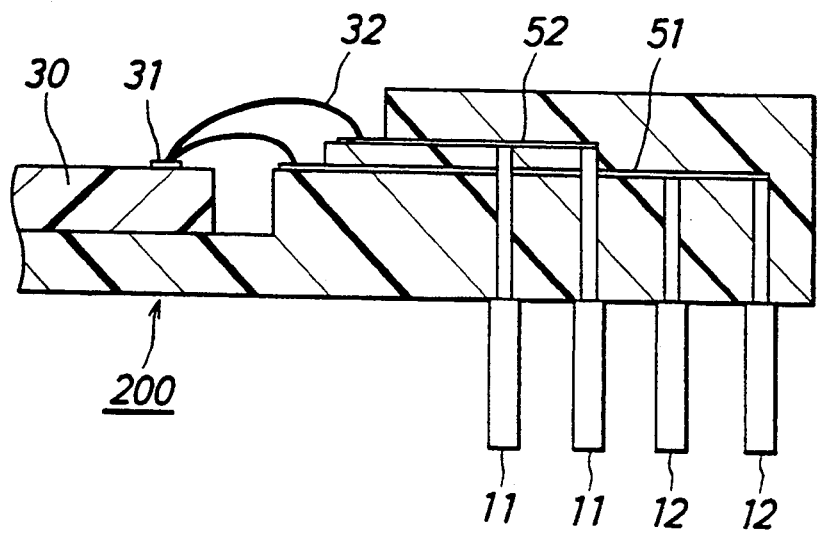

FIGS. 3A and 3B are a fragmentary plan view and a fragmentary sectional view of another embodiment of the master-slice type semiconductor integrated circuit device of the present invention. In these Figures, the same reference numerals are used to denote the same or corresponding parts as those appearing in FIGS. 2A and 2B.

Referring to FIGS. 3A and 3B, a package 200 has four rows of external pins, including outer external pins 12, 12 on outer two rows and inner external pins 11, 11 on the inner two rows. The outer external pins 12, 12 are connected to different bonding pads 31, 31 of an input cell 20, 20 through wires 51, 51 of the package 200 and via bonding wires 32, 32. In contrast, the inner external pins 11, 11 are connected to different bonding pads 31, 31 of input/output cells 21, 21 through wires 52, 52 of the package 200 and via bonding wires 32, 32.

In this second embodiment, as in the first embodiment described before, the output signals which induce most of the crosstalk noises are allocated to inner external pins 11, 11, generation of crosstalk noise is greatly reduced because the lengths of the signal lines connected to these external pins are small. In addition, since the wires for the output signals in the package 200 are laid in the wiring layer different from that of the wires for the input signals, any influence of the output signals on the input signals is diminished, thus reducing generation of noises in the input signals.

In each of the embodiments described hereinbefore, the external pins 11, 11 on the inner two rows of the pins are connected to the input/output cells 21, 21 of the semiconductor chip 30, while the external pins 12 of the outer two rows are connected to the input cells 20 of the semiconductor chip 30. This, however, is only illustrative and appreciable reduction in the noises due to crosstalk between adjacent signals lines can be attained by arranging such that at least the external pins of the outermost row are connected to the input cell 20, while at least the external pins of the innermost row are connected to the input/output cell 21.

Furthermore, although the described embodiments employ four rows of external pins, the PGA package can have any number of rows of the external pins not smaller than 2. In addition, the external pins may be arranged in a staggered manner although the illustrated embodiments employ a regular lattice-like arrangement of the external pins. The described advantages of the present invention are enjoyable even in such modifications, provided that at least the external pins of the outermost row are connected to the input cell, while at least the external pins of the innermost row are connected to the input/output cell.

As will be understood from the foregoing description, the present invention provides a master-slice type semiconductor integrated circuit device mounting a PGA package, wherein at least the outermost signal pins of the package are used exclusively for input signals, while at least the innermost external pins of the packages are used both for input and output signals. In addition, the signal lines in the package which are used exclusively for the input signals are made to have smaller widths than the signal lines which are used for output signals or both for input and output signals. Consequently, generation of crosstalk noises can be greatly reduced.

What is claimed is;

1. A master-slice type semiconductor integrated circuit device having a PGA package mounting a master-slice type semiconductor chip, comprising:
   input cells provided on said semiconductor chip and electrically connected to respective ones of external pins in the outermost one of a plurality of rows of the external pins via first wires in said PGA package;
   input/output cells provided on said semiconductor chip and electrically connected t respective ones of external pins in the innermost one of the plurality of rows of the external pins via second wires in said PGA package, said first wires in said PGA package connected to said external pins in the outermost one of the plurality of rows of said external pins having widths which are smaller than widths of the second wires in said package which are connected to said external pins in the innermost one of the plurality of rows of said external pins,
   a pair of said first wires being arranged with at least one of said second wires intervening between wires in the pair of first wires.

2. A master-slice type semiconductor integrated circuit device according to claim 1, wherein said wires connected to said external pins of the innermost side are used exclusively for transmission of output signals.

3. A master-slice type semiconductor integrated circuit device according to claim 1, wherein said external pins are arranged in a row along the side of said PGA package.

4. A master-slice type semiconductor integrated circuit device according to claim 1, wherein said external pins are arranged in a staggered manner.

5. In a master-slice type semiconductor integrated circuit device having a PGA package mounting a master-slice type semiconductor chip, the PGA package having a plurality of external pins arranged in a plurality of rows around the body of the package, the external pins in at least the outermost row being used exclusively for input signals, while the external pins in at least the innermost row are used for output signals or for both input and output signals, and the signal lines in the package connected to the external pins which are used exclusively for input signals have narrower widths than the signal lines connected to the external pins which are used for output signals or for both input and output signals.

6. A master-slice type semiconductor integrated circuit device having a PGA package mounting a master-slice type semiconductor chip, comprising:
   a PGA package having a plurality of wiring layers at different levels;
   input cells on said semiconductor chip and electrically connected to respective ones of external pins in an outer one of a plurality of rows of the external pins, said connection being made via first wires in one of said levels of said PGA package;
   input/output cells provided on said semiconductor chip and electrically connected to respective ones of external pins in an inner one of the plurality of rows of the external pins, said connection being made via second wires in another of said levels of said PGA package, said first wires in said PGA package connected to said external pins in the outer of the plurality of rows of said external pins having widths which are smaller than widths of the second wires in said PGA package which are connected to said external pins in the inner of the plurality of rows of said external pins, a pair of said first wires being arranged with at least one of said second wires intervening between wires in the pair of first wires.

\* \* \* \* \*